United States Patent
Kubo et al.

(10) Patent No.: US 9,484,476 B2
(45) Date of Patent: Nov. 1, 2016

(54) PHOTOELECTRIC CONVERSION DEVICE

(75) Inventors: Shintaro Kubo, Kirishima (JP); Michimasa Kikuchi, Omihachiman (JP); Hideaki Asao, Kyotanabe (JP); Shinnosuke Ushio, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 189 days.

(21) Appl. No.: 14/007,897

(22) PCT Filed: Mar. 15, 2012

(86) PCT No.: PCT/JP2012/056649
§ 371 (c)(1),
(2), (4) Date: Sep. 26, 2013

(87) PCT Pub. No.: WO2012/147427
PCT Pub. Date: Nov. 1, 2012

(65) Prior Publication Data
US 2014/0014177 A1    Jan. 16, 2014

(30) Foreign Application Priority Data
Apr. 25, 2011 (JP) ................................ 2011-097166

(51) Int. Cl.
*H01L 31/032* (2006.01)
*H01L 31/0368* (2006.01)
(Continued)

(52) U.S. Cl.
CPC ....... *H01L 31/0322* (2013.01); *H01L 31/0368* (2013.01); *H01L 31/046* (2014.12); *H01L 31/0749* (2013.01); *Y02E 10/541* (2013.01); *Y02E 10/543* (2013.01)

(58) Field of Classification Search
CPC ............. H01L 31/0322; H01L 31/046; H01L 31/0368; H01L 31/0748

USPC ............................................ 136/258; 438/95
See application file for complete search history.

(56) References Cited

U.S. PATENT DOCUMENTS 6,992,202 B1   1/2006  Banger et al.
8,097,305 B2   1/2012  Meyer et al.

FOREIGN PATENT DOCUMENTS

JP    H5-55614 A     3/1993
JP    H8-330614 A   12/1996
(Continued)

OTHER PUBLICATIONS

Tuttle, John R. et al.: "Thoughts on the Microstructure of Polycrystalline Thin Film CuInSe2 and Its Impact on Material and Device Performance", Solar Cells, Elsevier Sequoia.S.A. Lausanne, CH, vol. 30, No. 1/04, May 1, 1991, pp. 21-38.
(Continued)

*Primary Examiner* — Keith Hendricks
*Assistant Examiner* — Kourtney S Carlson
(74) *Attorney, Agent, or Firm* — Procopio Cory Hargreaves and Savitch LLP

(57) ABSTRACT

It is an object of the present invention to improve photoelectric conversion efficiency in a photoelectric conversion device. The photoelectric conversion device according to the present invention uses a polycrystalline semiconductor layer including a plurality of semiconductor particles coupled together as a light-absorbing layer, each of the semiconductor particles including a group I-III-VI compound, each of the semiconductor particles having a higher composition ratio PI of a group I-B element to a group III-B element in a surface portion thereof than that in a central portion thereof.

6 Claims, 6 Drawing Sheets

(51) Int. Cl.
*H01L 31/0749* (2012.01)
*H01L 31/046* (2014.01)

(56) References Cited

FOREIGN PATENT DOCUMENTS

| JP | 2004-111664 A | 4/2004 |
|---|---|---|
| JP | 2008-507835 A | 3/2008 |
| JP | 2010-129641 A | 6/2010 |

OTHER PUBLICATIONS

Tuttle, J.R. et al.: "Physical, chemical, and structural modifications to thin-film CuInSe2-based photovoltaic devices", Proceedings of the Photovoltaic Specialists Conference, New York, IEEE, US, vol. Conf. 22, Oct. 7, 1991, pp. 1062-1067.

Extended European Search Report dated Aug. 7, 2014 issued for International Application No. PCT/JP20102/056649.
International Search Report dated May 1, 2012, issued for International Application No. PCT/JP2012/056649.
D.F. Marron et al., Electronic structure of secondary phase in Cu-rich CuGaSe2 solar cell devices, Applied Phyics Letters, Oct. 25, 2004, vol. 85, No. 17, pp. 3755-3757.
M. Hafemeister et al., Large Neutral Barrier at Grain Boundaries in Chalcopyrite This Films, Physical Review Letters, May 14, 2010, vol. 104, No. 19, pp. 196602-1-196602-4.
M. Kawamura et. al/, Grain Boundary Evaluation of Cu(In1-xGax)Se2 Solar Cells, Japanese Journal of Applied Physics, Jun. 21, 2010, vol. 49, No. 6, pp. 062301-1-062301-3.
S. Ishizuka et al., Control of thin film properties of Cu(In, Ga)Se2 using water vapor introduction during growth, Journal of Applied Physics, Nov. 7, 2006, vol. 100, pp. 096196-1-096196-3.
International Preliminary Report on Patentability issued for International Application No. PCT/JP2012/056649.

F I G . 1
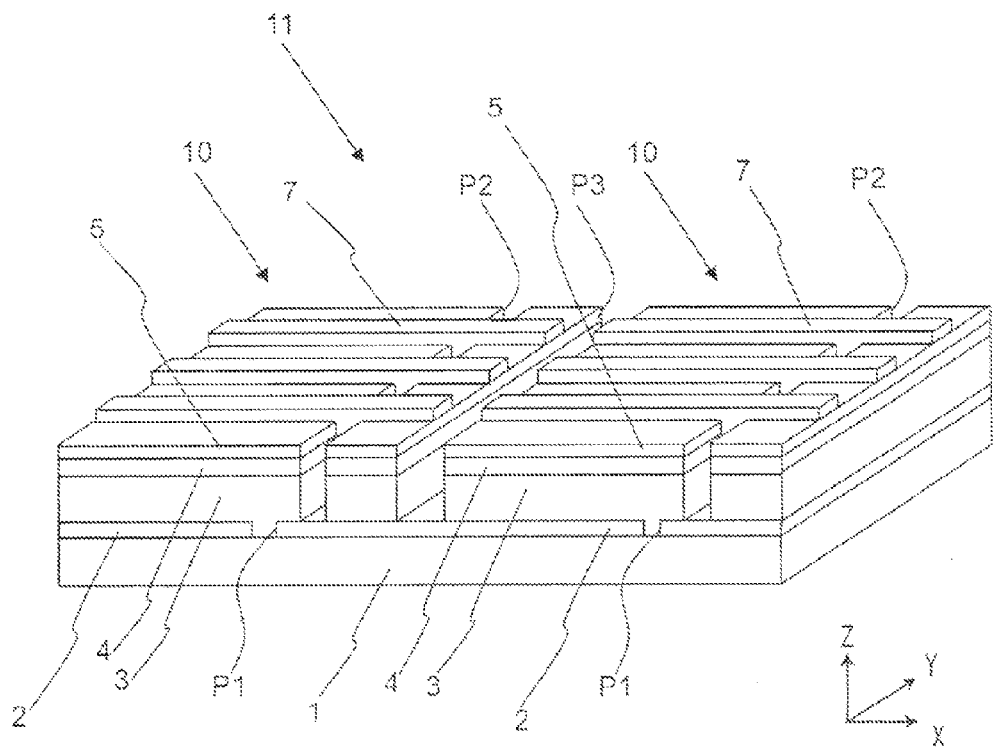
F I G . 2
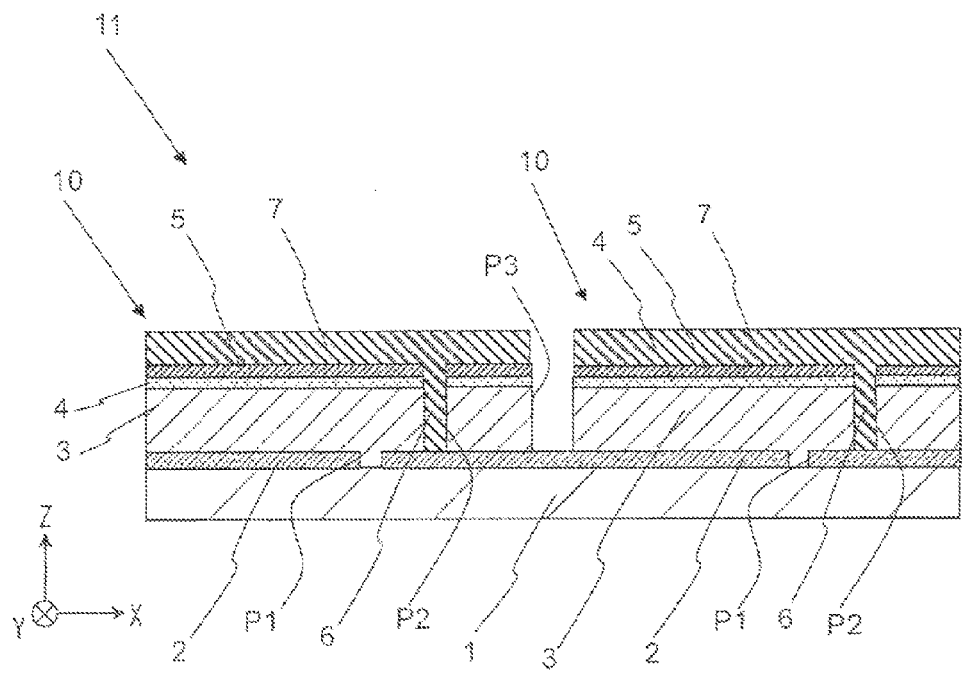

PHOTOELECTRIC CONVERSION DEVICE

TECHNICAL FIELD

The present invention relates to a photoelectric conversion device including a group I-III-VI compound semiconductor.

BACKGROUND ART

Some photoelectric conversion devices for use in solar photovoltaic power generation and the like include light-absorbing layers made of chalcopyrite-based group I-III-VI compound semiconductors such as CIS and GIGS. Such a photoelectric conversion device is disclosed, for example, in Japanese Patent Application Laid-Open. No. 8-330614 (1996) (which is referred to hereinafter as Patent Literature 1).

The group I-III-VI compound semiconductors, which are high in optical absorption coefficient, are suitable for the reduction in thickness of photoelectric conversion devices, the increase in area thereof and the suppression of manufacturing costs thereof. Research and development of next-generation solar cells using the group I-III-VI compound semiconductors has been promoted.

A photoelectric conversion device including such a group I-III-VI compound semiconductor is configured to include a plurality of photoelectric conversion cells arranged two-dimensionally in juxtaposition. Each of the photoelectric conversion cells includes a lower electrode such as a metal electrode, a semiconductor layer including a light-absorbing layer, a buffer layer and the like, and an upper electrode such as a transparent electrode and a metal electrode, which are stacked in the order named on a substrate made of glass and the like. Adjacent ones of the photoelectric conversion cells are electrically connected in series with each other by electrically connecting the upper electrode of one of the adjacent photoelectric conversion cells and the lower electrode of the other of the adjacent photoelectric conversion cells with a connection conductor.

SUMMARY OF INVENTION

An improvement in photoelectric conversion efficiency is constantly required for a photoelectric conversion device including a group I-III-VI compound semiconductor. It is therefore an object of the present invention to improve photoelectric conversion efficiency in a photoelectric conversion device.

A photoelectric conversion device according to one embodiment of the present invention uses a polycrystalline semiconductor layer including a plurality of semiconductor particles coupled together as a light-absorbing layer, each of the semiconductor particles including a group compound, each of the semiconductor particles having a higher composition ratio $P_f$ of a group I-B element to a group III-B element in a surface portion thereof than that in a central portion thereof.

According to the aforementioned embodiment of the present invention, the provision of the photoelectric conversion device having high photoelectric conversion efficiency is achieved.

BRIEF DESCRIPTION OF DRAWINGS

FIG. 1 is a schematic view of a photoelectric conversion device as seen obliquely from above according to one embodiment of the present invention.

FIG. 2 is a schematic view showing a cross section of the photoelectric conversion device of FIG. 1.

EMBODIMENT FOR CARRYING OUT THE INVENTION

Figure 3:
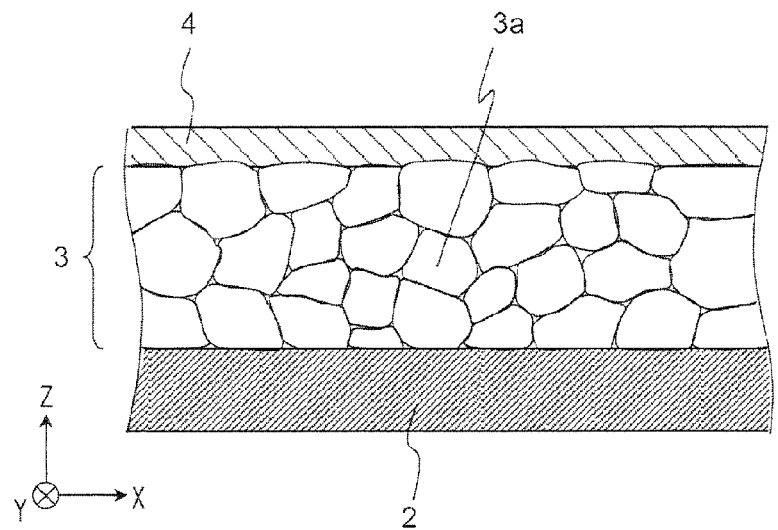
FIG. 3 is a schematic view showing the presence of semiconductor particles in a light-absorbing layer.

A photoelectric conversion device according to one embodiment of the present invention will be described with reference to the drawings. In the drawings, parts comprising the same components and having same functions are designated by the same reference signs and duplicated explanations are omitted in the Wowing explanations. The drawings are shown schematically, and the size, positional relationship and the like of the various structures are not precisely shown in the figures.

<(1) Configuration of Photoelectric Conversion Device>

FIG. 1 is a perspective view showing a configuration of a photoelectric conversion device 11. FIG. 2 is an XZ sectional view of the photoelectric conversion device 11 of FIG. 1. A right-handed XYZ coordinate system in which the direction of arrangement of photoelectric conversion cells 10 (left-hand and right-hand directions as seen in FIG. 1) is defined as the direction of an X axis is added to FIGS. 1 to 3.

The photoelectric conversion device 11 is configured to include the plurality of photoelectric conversion cells 10 arranged in juxtaposition on a substrate 1. For purposes of illustration, only two photoelectric conversion cells 10 are shown in FIG. 1. In the actual photoelectric conversion device 11, a large number of photoelectric conversion cells 10 are arranged in a plane (two-dimensionally) in the direction of the X axis in the figures and/or in the direction of a Y axis in the figures.

Each of the photoelectric conversion cells 10 mainly includes a lower electrode layer 2, a light-absorbing layer (hereinafter referred to also as a first semiconductor layer) 3, a second semiconductor layer 4, an upper electrode layer 5, and collecting electrodes 7. A main surface of the photoelectric conversion device 11 on which the upper electrode layer 5 and the collecting electrodes 7 are provided serves as a light receiving surface. Three types of groove portions referred to as first to third groove portions P1, P2 and P3 are also provided in the photoelectric conversion device 11.

The substrate 1 supports the plurality of photoelectric conversion cells 10, and made of a material selected from the group comprising of glass, ceramics, resins, metal and the like, for example. The substrate 1 used herein is made of soda-lime glass having a thickness on the order of 1 to 3 mm.

The lower electrode layer 2 is a conductive layer provided on one main surface of the substrate 1, and is made of a metal selected from the group comprising of molybdenum (Mo), aluminum (Al), titanium (Ti), tantalum (Ta), gold (Au) and the like or a laminated structure of these metals. The lower electrode layer 2 has a thickness on the order of 0.2 to 1 μm, and is formed by a known thin film formation method such as a sputtering method or a vapor deposition method, for example.

The first semiconductor layer 3 serving as the light-absorbing layer is a semiconductor layer provided on a main surface (referred to also as one main surface) on the positive Z side of the lower electrode layer 2 and having a first conductivity type (herein, a p type), and has a thickness on the order of 1 to 3 μm. The first semiconductor layer 3 is a polycrystalline semiconductor layer formed by coupling a plurality of semiconductor particles mainly made of a semiconductor of chalcopyrite-based group I-III-VI compound (referred to also as a group I-III-VI compound semiconductor).

From the viewpoint of improving the photoelectric conversion efficiency, the semiconductor particles forming the first semiconductor layer 3 may have an average particle diameter of not less than 200 nm. From the viewpoint of improving the adhesion to the lower electrode layer 2, the semiconductor particles forming the first semiconductor layer 3 may have an average particle diameter of not more than 1000 nm. The average particle diameter of the semiconductor particles is measured in a manner to be described below. First, images (referred to also as sectional images) of a cross section of the first semiconductor layer 3 at ten arbitrary balanced locations are acquired by photographing with a scanning electron microscope (SEM). Next, a transparent film is overlaid on each of the sectional images, and grain boundaries are traced over the transparent film with a pen. At this time, a line (referred to also as a scale bar) indicating a predetermined distance (for example, 1 μm) displayed near a corner of each sectional image is also traced with a pen. A scanner is used to read the transparent film on which the grain boundaries and the scale bar are written with the pen, thereby acquiring image data. Predetermined image processing software is used to calculate the areas of the respective semiconductor particles from the aforementioned image data. Particle diameters in the case where the semiconductor particles are regarded as being spherical are calculated from the calculated areas. The average particle diameter is calculated from the average value of the particle diameters of the plurality of semiconductor particles captured by the ten sectional images.

The group I-III-VI compound is a compound of a group I-B element (in the present description, group names are described according to the old IUPAC system; a group I-B element is also referred to as a group 11 element according to the new IUPAC system), a group III-B element (also referred to as a group 13 element), and a group VI-B element (also referred to as a group 16 element). Examples of the group I-III-VI compound used herein include $CuInSe_2$ (copper indium diselenide; referred to also as CIS), $Cu(In,Ga)Se_2$ (copper indium gallium diselenide; referred to also as CIGS), and $Cu(In,Ga)(Se,S)_2$. (copper indium gallium di(selenide/sulfide); referred to also as CIGSS). It should be noted that the first semiconductor layer 3 may be formed by a thin film of multinary compound semiconductor such as copper indium gallium diselenide having a copper indium gallium di(selenide/sulfide) layer in the form of a thin film as a surface layer. It should be noted that the light-absorbing layer 3 used herein is made of CIGS.

Figure 4:
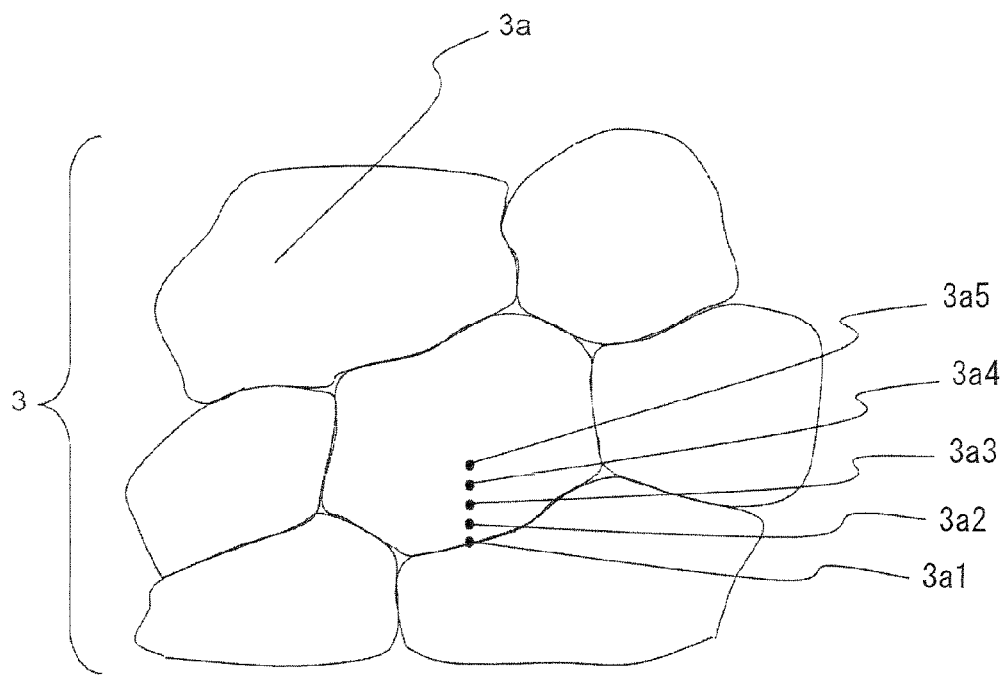
FIG. 4 is an enlarged view of the light-absorbing layer of FIG. 3.

FIG. 3 is a schematic view showing a configuration, with attention focused on the lower electrode layer 2, the first semiconductor layer 3 and the second semiconductor layer 4. The first semiconductor layer 3 has a polycrystalline structure including a plurality of semiconductor particles 3a coupled together. FIG. 4 is a view showing this first semiconductor layer 3 further enlarged.

Each of the semiconductor particles 3a constituting the first semiconductor layer 3 includes a group I-III-VI compound. In each of the semiconductor particles 3a, the composition ratio $P_I$ of the group I-B element to the group III-B element is higher in a surface portion of each semiconductor particle 3a than in a central portion thereof. Such a configuration decreases the resistance value of the surface portion of each semiconductor particle 3a to suppress the recombination of carriers near the grain boundaries. As a result, the photoelectric conversion efficiency of the photoelectric conversion device 11 is improved.

In each of the semiconductor particles 3a, the composition ratio $P_{VI}$ of the group VI-B element to the group III-B element may be higher in the surface portion of each semiconductor particle 3a than in the central portion thereof. Such a configuration decreases group VI-B element defects in the surface portion of each semiconductor particle 3a to suppress the recombination of carriers near the grain boundaries. The higher proportions of the group I-B element and the group VI-B element in the surface portion near the grain boundaries increases the energy position of the conduction band of the surface portion to shorten the residence time of carriers, thereby suppressing the recombination of the carriers near the grain boundaries. Because of these facts, the photoelectric conversion efficiency of the photoelectric conversion device 11 is further improved.

It should be noted that the surface portion of each semiconductor particle 3a refers to a region including the grain boundaries of the semiconductor particles 3a and extending from the grain boundary surface to one tenth of the diameter of each semiconductor particle 3a. The central portion of each semiconductor particle 3a refers to a region lying inside the aforementioned surface portion. From the viewpoint of providing good conductivity of carriers to further improve the photoelectric conversion efficiency, the composition ratio PI of the group I-B element to the group III-B element and the composition ratio PVI of the group VI-B element to the group III-B element in each semiconductor particle 3a may increase gradually toward the surface of each semiconductor particle 3a. For example, when comparisons are made between points 3a1 to 3a5 in a semiconductor particle 3a in FIG. 4, PI and PVI may increase gradually from the point 3a5 toward the point 3a1.

It should be noted that the aforementioned composition ratio $P_I$ and the composition ratio $P_{VI}$ are measured in a manner to be described below. First, a cross section of the first semiconductor layer 3 is observed with a transmission electron microscope (TEM), and an EDS analysis is performed at a desired point in a semiconductor particle 3a. The ratio $M_I$ of the number of atoms of the group I-B element, the ratio $M_{III}$ of the number of atoms of the group III-B element, and the ratio $M_{VI}$ of the number of atoms of the group VI-B element at that point are measured by the EDS analysis. From these measurement results, the composition ratio $P_I$ of the group I-B element to the group III-B element is given by $M_I/M_{III}$, and the composition ratio $P_{VI}$ of the of the group VI-B element to the group III-B element is given by $M_{VI}/M_{III}$.

Figure 10:
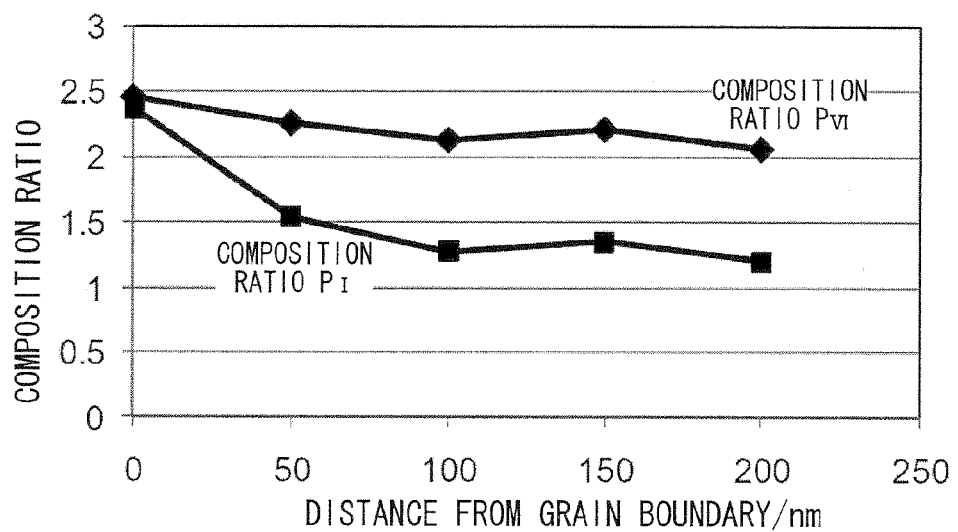
FIG. 10 is a graph showing distributions of elemental composition ratios in a semiconductor particle in the light-absorbing layer.

FIG. 10 shows an example of distributions of the composition ratio $P_I$ and the composition ratio $P_{VI}$ at a point immediately over a grain boundary and points displaced at intervals of 50 nm from the gain boundary toward the center for a semiconductor particle 3a having a particle diameter of 500 nm. In FIG. 10, the composition ratio $P_I$ at the point in the central portion (200 nm apart from the grain boundary) of the semiconductor particle 3a is 1.2, whereas the composition ratio $P_I$ at the point in the surface portion (0 nm apart from the grain boundary, i.e. immediately over the grain boundary) is 2.4 which is greater the former. Also, the composition ratio $P_{VI}$ at the point in the central portion (200 nm apart from the grain boundary) of the semiconductor particle 3a is 2.1, whereas the composition ratio $P_{VI}$ at the point in the surface portion (0 nm apart from the grain boundary) is 2.5 which is greater than the former.

The second semiconductor layer 4 is a semiconductor layer provided on one main surface of the first semiconductor layer 3. The second semiconductor layer 4 has a conductivity type (herein, an n type) different from that of the first semiconductor layer 3. A junction between the first semiconductor layer 3 and the second semiconductor layer 4 provides good charge separation of positive and negative carriers generated by the photoelectric conversion in the first semiconductor layer 3. It should be noted that semiconductors different in conductivity type refer to semiconductors different in conductive carriers. When the conductivity type of the first semiconductor layer 3 is the p type as mentioned above, the conductivity type of the second semiconductor layer 4 may be an i type, rather than the n type. An alternative configuration can be such that the conductivity type of the first semiconductor layer 3 is the n or i type whereas the conductivity type of the second semiconductor layer 4 is the p type.

The second semiconductor layer 4 is made of a compound semiconductor such as cadmium sulfide (CdS), indium sulfide ($In_2S_3$), zinc sulfide (ZnS), zinc oxide (ZnO), indium selenide ($In_2Se_3$), In(OH,S), (Zn,In)(Se,OH), and (Zn,Mg)O. From the viewpoint of reducing losses in electrical current, the second semiconductor layer 4 may have a resistivity of not less than 1 Ω·cm. It should be noted that the second semiconductor layer 4 is formed by a chemical bath deposition (CBD) method, for example.

The second semiconductor layer 4 has a thickness extending in a direction normal to the one main surface of the first semiconductor layer 3. This thickness is in the range of 10 to 200 nm, and may be 100 to 200 nm from the viewpoint of suppressing damages during the production of the upper electrode layer 5 on the second semiconductor layer 4 by a sputtering method and the like.

The upper electrode layer 5 is a transparent conductive film provided on the second semiconductor layer 4 and having a conductivity type that is the n type. The upper electrode layer 5 is an electrode for drawing electrical charges generated in the first semiconductor layer 3. The upper electrode layer 5 is made of a material having a resistivity lower than that of the second semiconductor layer 4. The upper electrode layer 5 includes what is called a window layer. When a transparent conductive film is provided in addition to the window layer, these may be regarded integrally as the upper electrode layer 5.

The upper electrode layer 5 mainly include a transparent low-resistance material having a wide band gap. Examples of such a material used herein include metal oxide semiconductors such as ZnO, In2O3 and SnO2. These metal oxide semiconductors may include an element selected from the group comprising of Al, B, Ga, In, F and the like. Specific examples of the metal oxide semiconductors including such elements include AZO (Aluminum Zinc Oxide), GZO (Gallium Zinc Oxide), IZO (Indium Zinc Oxide), ITO (Indium Tin Oxide) and FTO (Fluorine Tin Oxide).

The upper electrode layer 5 is formed to have a thickness in the range of 0.05 to 3.0 μm by a sputtering method, a vapor deposition method, a chemical vapor deposition (CVD) method or the like. From the viewpoint of drawing electrical charges from the first semiconductor layer 3 well, the upper electrode layer 5 may have a resistivity of less than 1 Ω·cm and a sheet resistance of not more than 50 Ω/□.

The second semiconductor layer 4 and the upper electrode layer 5 may be made of a material having the property of being easily light-permeable (referred to also as a light permeability) to a wavelength range of light which the first semiconductor layer 3 absorbs. This reduces the lowering of light absorption efficiency in the first semiconductor layer 3 which is caused by the provision of the second semiconductor layer 4 and the upper electrode layer 5.

The upper electrode layer 5 may have a thickness in the range of 0.05 to 0.5 μm from the viewpoints of enhancing the effect of preventing losses of light reflection and a light scattering effect and transmitting electrical current generated by the photoelectric conversion well as well as enhancing the light permeability. Further, the upper electrode layer 5 and the second semiconductor layer 4 may be made approximately equal in absolute refractive index to each other from the viewpoint of reducing the losses of light reflection at an interface between the upper electrode layer 5 and the second semiconductor layer 4.

The collecting electrodes 7 are disposed in spaced apart relation in the direction of the Y axis. Each of the collecting electrodes 7 extends in the direction of the X axis. The collecting electrodes 7 are conductive electrodes, and are made of metal such as silver (Ag), for example.

The collecting electrodes 7 have the function of collecting the electrical charges generated in the first semiconductor layer 3 and drawn in the upper electrode layer 5. The provision of the collecting electrodes 7 achieves the reduction in the thickness of the upper electrode layer 5.

The electrical charges collected by the collecting electrodes 7 and the upper electrode layer 5 are transmitted through a connection conductor 6 provided in the second groove portion P2 to an adjacent one of the photoelectric conversion cells 10. The connection conductor 6 is formed, for example, by part of the collecting electrodes 7 extending in the direction of the Y axis, as shown in FIG. 2. Thus, the lower electrode layer 2 of one of the adjacent photoelectric conversion cells 10 and the collecting electrodes 7 of the other of the adjacent photoelectric conversion cells 10 are electrically connected in series with each other through the connection conductor 6 provided in the second groove portion P2 in the photoelectric conversion device 11. The connection conductor 6 is not limited to this, but may be formed by an extending part of the upper electrode layer 5.

The collecting electrodes 7 may have a width in the range of 50 to 400 μm so as to minimize the reduction in the light-receiving area which influences the amount of light incident on the first semiconductor layer 3 while ensuring the good conductivity thereof.

<(2) Method of Manufacturing Photoelectric Conversion Device>

FIGS. 5 to 9 are sectional views schematically showing the photoelectric conversion device 11 in the course of the manufacture thereof. It should be noted that each of the sectional views shown in FIGS. 5 to 9 shows a portion corresponding to a cross section shown in FIG. 2 in the course of the manufacture thereof.

Figure 5:
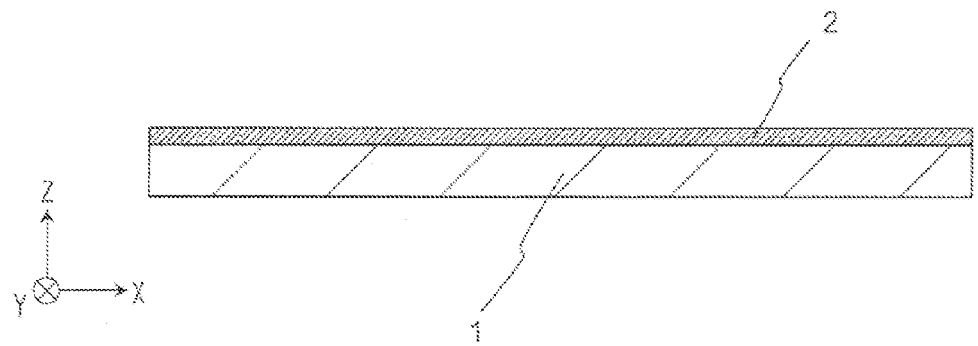
FIG. 5 is a sectional view schematically showing a photoelectric conversion device in the course of the manufacture thereof.
Figure 6:
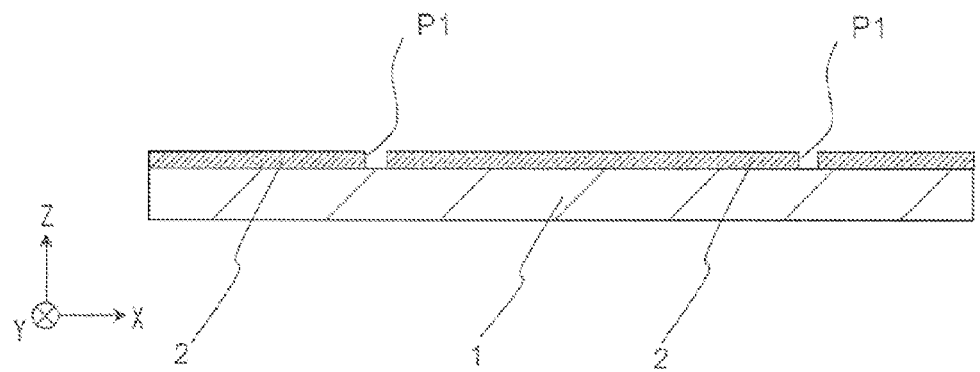
FIG. 6 is a sectional view schematically showing the photoelectric conversion device in the course of the manufacture thereof.

As shown in FIG. 5, the lower electrode layer 2 made of Mo and the like is initially deposited on substantially the entire surface of the cleaned substrate 1 by using a sputtering method and the like. Then, the first groove portion P1 is formed which extends from a linear to-be-formed position along the Y direction at the upper surface of the lower electrode layer 2 to the upper surface of the substrate 1 immediately thereunder. The first groove portion P1 may be formed by a scribing process in which grooving is performed by irradiating the to-be-formed position with laser light using a YAG laser and the like while scanning the to-be-formed position therewith, for example. FIG. 6 is a view showing a state after the formation of the first groove portion P1.

Figure 7:
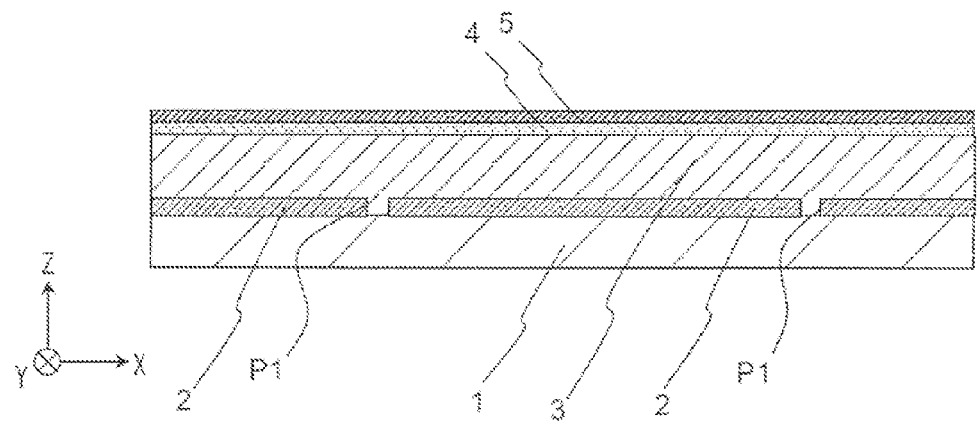
FIG. 7 is a sectional view schematically showing the photoelectric conversion device in the course of the manufacture thereof.

After the first groove portion P1 is formed, the first semiconductor layer 3, the second semiconductor layer 4 and the upper electrode layer 5 are formed in order on the lower electrode layer 2. FIG. 7 is a view showing a state after the formation of the first semiconductor layer 3, the second semiconductor layer 4 and the upper electrode layer 5.

The first semiconductor layer 3 is formed by a process referred to as what is called a coating process or a printing process. In the coating process, a semiconductor forming solution including an element forming the first semiconductor layer 3 is applied onto the lower electrode layer 2, and drying and heat treatment are thereafter performed in order.

The semiconductor forming solution used herein may be a solution in which a single source precursor is dissolved in a solvent, the single source precursor being configured such that a group I-B element, a group III-B element and a group VI-B element constituting a group I-III-VI compound semiconductor are contained in a single molecule (See the specification of U.S. Pat. No. 6,992,202). Also various organic solvents or water are used as the solvent used for the semiconductor forming solution. The single source precursor used herein may have a structure, for example, represented by Chemical Formula (1):

[Chemical Formula 1]

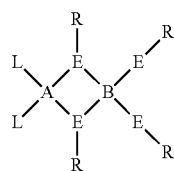

(1)

In Chemical Formula (1), E is a chalcogen element, R is an organic compound, R-E is a chalcogen-element-containing organic compound, L is a Lewis base, A is a group I-B element, and B is a group III-B element.

The chalcogen element used herein refers to S, Sc and Te among group VI-B elements. The chalcogen-element-containing organic compound refers to an organic compound containing a chalcogen element, and is an organic compound having a covalent bond between a carbon element and a chalcogen element. Examples of the chalcogen-element-containing organic compound include thiols, sulfides, disulfides, thiophenes, sulfoxides, sulfones, thioketones, sulfonic acids, sulfonic acid esters, sulfonic acid amides, selenols, selenides, diselenides, selenoxides, selenones, tellurols, tellurides, and ditellurides. From the viewpoint of easily producing the semiconductor forming solution, the chalcogen-element-containing organic compound used for the single source precursor may be thiols, sulfides, disulfides, selenols, selenides, diselenides, tellurols, tellurides, ditellurides or the like which are high in coordination power to metal.

The Lewis base refers to a compound including an unshared electron pair. Examples of the Lewis base used herein include organic compounds comprising a functional group containing a group V-B element (also referred to as a group 15 element) including an unshared electron pair and a functional group containing a group VI-B element including an unshared electron pair. A compound comprising an aryl group may be used as the Lewis base from the viewpoint of enhancing the solubility in an organic solvent to easily produce a semiconductor forming solution having a high concentration. Examples of such a Lewis base used herein include triarylphosphines.

A specific example of the single source precursor includes a structure represented by Chemical Formula (2) to be described below, for example, when the chalcogen-element-containing organic compound is phenyl selenol, the Lewis base is triphenylphosphine, the group I-B element is Cu, and the group III-B element is In. Another specific example of a single source precursor includes a structure represented by Chemical Formula (3) to be described below in which Ga is used in place of In as the group III-B element in Chemical Formula (2). When In and Ga are included as the group I-III-VI compound such as CIGS, a mixture of the single source precursor represented by Chemical Formula (2) and the single source precursor represented by Chemical Formula (3) may be included in the semiconductor forming solution. In Chemical Formula (2) and Chemical Formula (3), Ph is a phenyl group.

[Chemical Formula 2]

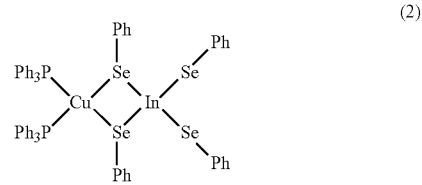

(2)

[Chemical Formula 3]

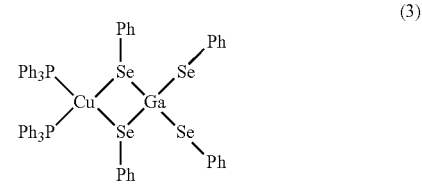

(3)

The semiconductor forming solution produced in the aforementioned manner is applied onto one main surface of the lower electrode layer 2 to form a film, and a heat treatment is thereafter performed on the film, so that the first semiconductor layer 3 is formed. For example, a spin coater, screen printing, dipping, spraying, a die coater or the like is used for the application of the semiconductor forming solution.

The heat treatment of the aforementioned film includes a step (referred to hereinafter as a thermal decomposition step) in which organic components in the film are thermally decomposed, and a step (referred to hereinafter as a crystallization step) in which the group I-B element, the group III-B element and the group VI-B element react chemically with each other to generate and crystallize a group I-III-VI compound. Water vapor is contained in an atmosphere in this thermal decomposition step. Thus, the composition ratio $P_I$ of the group I-B element to the group III-B element can be higher in the surface portion of each semiconductor particle $3a$ than in the central portion thereof.

The thermal decomposition step is performed in an inert atmosphere containing water vapor or in a reductive atmosphere containing water vapor, and the temperature during the thermal decomposition may be 50° to 350° C., for example. An example of this inert atmosphere includes a nitrogen atmosphere. Examples of the reductive atmosphere include a forming gas atmosphere and a hydrogen atmosphere. Water vapor contained in these atmospheres may be 20 to 1000 ppm in volume fraction, for example.

The reason why the waver vapor contained in the atmosphere in the thermal decomposition step causes the difference in the composition ratio $P_I$ in each semiconductor particle $3a$ has not been well known, but a phenomenon to be described below is considered to take place. First, by heating the film in an atmosphere containing water vapor, the single source precursor in the film is decomposed to become a complex (referred to hereinafter as a group I complex) containing a group I-B element and a complex (referred to hereinafter as a group III complex) containing a group III-B element. The group III complex is thermally decomposed earlier to generate a solid (referred to hereinafter as a group III solid) containing the group III-B element, whereas the group complex still remains liquid in a complex state, so that the liquid group I complex surrounds the group III solid. As a result, concentration distributions of the group III-B element and the group I-B element are considered to be produced.

After this thermal decomposition step, the crystallization step is performed. The crystallization step is performed in an inert atmosphere containing the chalcogen element or in a reductive atmosphere containing the chalcogen element, and the heat treatment temperature may be 400° to 600° C., for example. The chalcogen element can be contained in the states of S vapor, Se vapor, $H_2S$, $H_2Se$ and the like in the atmosphere. In this crystallization step, the group I-B element, the group III-B element and the group VI-B element chemically react with each other to become a polycrystal of the group I-III-VI compound. At this time, it is considered that the concentration distributions of the group III-B element and the group I-B element formed in the thermal decomposition step are maintained to a certain degree to cause the difference in the composition ratio $P_I$ in each semiconductor particle $3a$ generated.

The composition of the group VI-B element in each semiconductor particle $3a$ may be changed by adjusting the concentration of the chalcogen element in the atmosphere, the rate of temperature increase and the like in the early stage of the crystallization step. For example, the heat treatment temperature is increased from near room temperature to a crystallization temperature of 400° to 600° C. at a relatively slow rate of approximately 4° to 9° C./minute in the early stage of the crystallization step. Also, the concentration of the chalcogen element in the atmosphere during the temperature increase is made relatively high in the range of 200 to 1000 ppm in partial pressure ratio. Thus, the composition ratio $P_{VI}$ of the group VI-B element to the group III-B element can be higher in the surface portion of each semiconductor particle $3a$ than in the central portion thereof. This is because the promotion of changes to chalcogen in the early stage of the crystallization step facilitates the formation of each semiconductor particle $3a$ and the formation of a chalcopyrite structure having a high melting point in the surface portion of each semiconductor particle $3a$. Then, the surface portion suppresses the diffusion of the chalcogen element toward the inside. Thus, the composition gradient of the group VI-B element is considered to be formed.

The second semiconductor layer 4 is formed by a chemical bath deposition method (also referred to as a CBD method). For example, cadmium acetate and thiourea are dissolved in aqueous ammonia, and the substrate 1 subjected to the processes until the formation of the first semiconductor layer 3 is immersed in this solution, so that the second semiconductor layer 4 made of CdS is formed on the first semiconductor layer 3.

The upper electrode layer 5 is a transparent conductive film including indium oxide containing Sn (ITO) and the like as a main ingredient, for example, and is formed by a sputtering method, an evaporation method or a CVD method.

Figure 8:
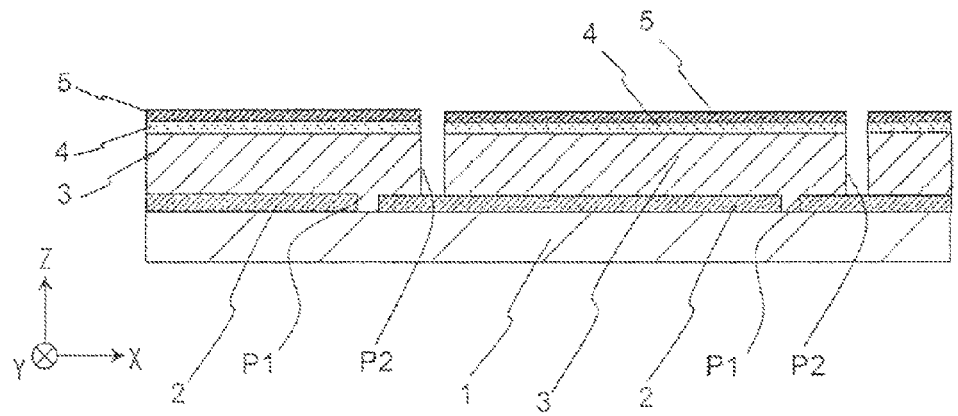
FIG. 8 is a sectional view schematically showing the photoelectric conversion device in the course of the manufacture thereof.

After the formation of the first semiconductor layer 3, the second semiconductor layer 4 and the upper electrode layer 5, the second groove portion P2 is formed which extends from a linear to-be-formed position along the Y direction at the upper surface of the upper electrode layer 5 to the upper surface of the lower electrode layer 2 immediately thereunder. The second groove portion P2 is formed, for example, by scribing several times in succession using a scriber having a scribing width of the order of 40 to 50 μm while displacing a pitch. Also, the second groove portion P2 may be formed by scribing after the tip shape of the scriber is widened to approximately the width of the second groove portion P2. Alternatively, the second groove portion P2 may be formed by scribing once to several times while two or more scribers are fixed in abutment with or in close proximity with each other. FIG. 8 is a view showing a state after the formation of the second groove portion P2. The second groove portion P2 is formed in a position slightly displaced in an X direction (in the figure, the positive X direction) from the first groove portion P1.

Figure 9:
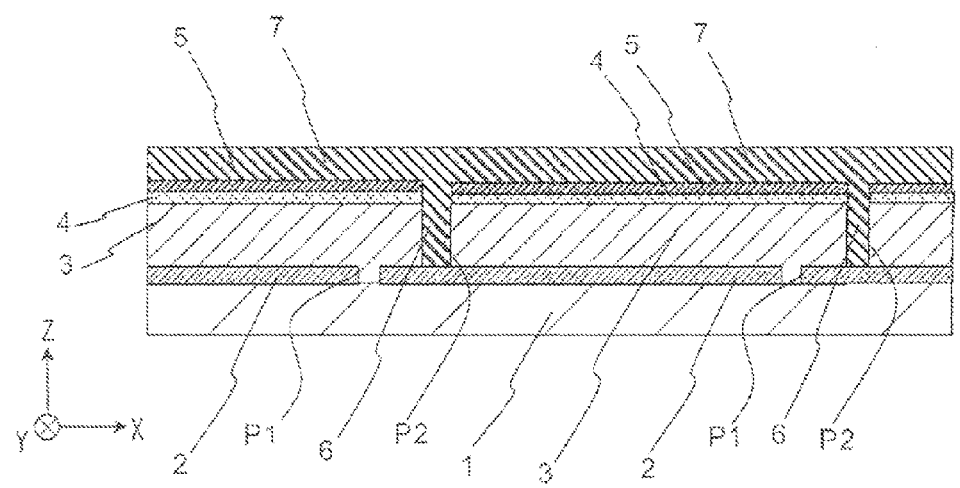
FIG. 9 is a sectional view schematically showing the photoelectric conversion device in the course of the manufacture thereof.

After the formation of the second groove portion P2, the collecting electrodes 7 and the connection conductor 6 are formed. The collecting electrodes 7 and the connection conductor 6 are formed, for example, in a manner to be described below. First, a paste also referred to as a conductive paste) having conductivity and configured such that powder of metal such as Ag is dispersed in a resin binder is printed so as to draw a desired pattern. Then, the paste is dried to solidify, The solidified state includes both a solid state after melting in the case where the binder used for the conductive paste is a thermoplastic resin, and a state after hardening in the case where the binder is a hardening resin such as a thermosetting resin and a photo-curable resin. FIG. 9 is a view showing a state after the formation of the collecting electrodes 7 and the connection conductor 6.

After the formation of the collecting electrodes 7 and the connection conductor 6, the third groove portion P3 is formed which extends from a linear to-be-formed position at the upper surface of the upper electrode layer 5 to the upper surface of the lower electrode layer 2 immediately thereunder. It is preferable that the width of the third groove portion P3 is on the order of 40 to 1000 µm, for example. It is also preferable that the third groove portion P3 is formed by mechanical scribing in a manner similar to that for the second groove portion P2. In this manner, the third groove portion P3 is formed. Thus, the photoelectric conversion device 11 shown in FIG. 1 and FIG. 2 is manufactured.

<Configuration of Photoelectric Conversion Device according to Another Embodiment>

Figure 13:
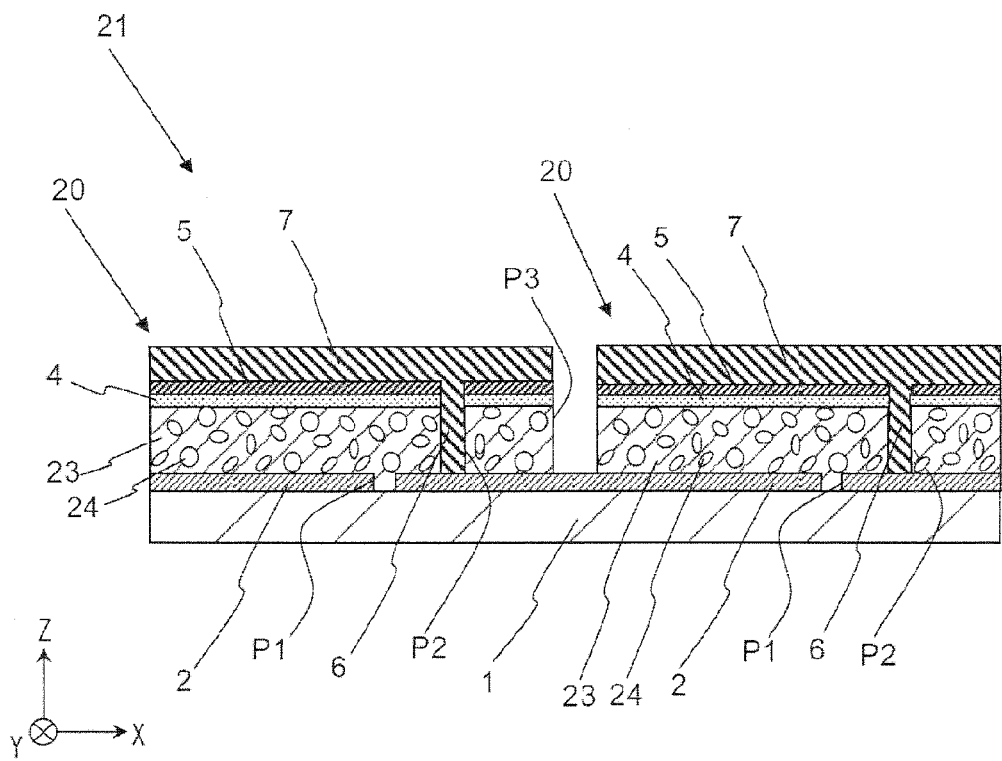
FIG. 13 is a schematic view showing a cross section of the photoelectric conversion device according to another embodiment of the present invention.

The present invention is not limited to the aforementioned embodiment, but various modifications may be made therein without departing from the spirit and scope of the present invention. For example, a plurality of voids may be present in the first semiconductor layer, as shown in FIG. 13, in addition to the provision of the semiconductor particles in the first semiconductor layer, each of the semiconductor particles being characterized in that the composition ratio $P_I$ of the group I-B element to the group III-B element is higher in the surface portion thereof than in the central portion thereof, as mentioned above. FIG. 13 is a sectional view of a photoelectric conversion device 21 according to another embodiment of the present invention. Same reference numerals and characters are used to designate parts including components and having functions of the photoelectric conversion device 21 which are similar to those of the photoelectric conversion device 11 shown in FIG. 1 and FIG. 2. The photoelectric conversion device 21 differs from the photoelectric conversion device 11 in that a plurality of voids 24 are present in a first semiconductor layer 23.

In such a configuration, when stresses are applied to the photoelectric conversion device 21, the voids 24 present in the first semiconductor layer 23 effectively alleviate the stresses to effectively reduce cracks occurring in the first semiconductor layer 23. On the other hand, when the voids 24 are present in the first semiconductor layer 23 in this manner, defects are prone to be formed in the first semiconductor layer 23 exposed to the voids 24. However, the composition ratio $P_I$ of the group I-B element to the group element is higher in the surface portion of each semiconductor particle constituting the first semiconductor layer 23 than in the central portion thereof, as mentioned above. This suppresses the recombination of carriers near the grain boundaries of the semiconductor particles to maintain high photoelectric conversion efficiency. As a result, the photoelectric conversion device 21 is high in resistance to stresses and has high photoelectric conversion efficiency.

EXAMPLE

Next, the photoelectric conversion device 11 will be described using a specific example.

First, Steps [a] to [d] to be described next were performed in order so as to produce a semiconductor forming solution.

[a] After 10 mmol of $Cu(CH_3CN)_4 \cdot PF_6$ which was an organometallic complex of a group I-B element and 20 mmol of $P(C_6H_5)_3$ which was a Lewis base were dissolved in 100 ml of acetonitrile, agitation was performed at room temperature (25° C.) for five hours to prepare a first complex solution.

[b] After 40 mmol of sodium t ethoxide ($NaOCH_3$) and 40 mmol of phenyl selenol ($HSeC_6H_5$) which was a chalcogen-element-containing organic compound were dissolved in 300 ml of methanol, and 6 mmol of $InCl_3$ and 4 mmol of $GaCl_3$ were further dissolved therein, agitation was performed at room temperature for five hours to prepare a second complex solution.

[c] The second complex solution prepared in Step [b] was dripped into the first complex solution prepared in Step [a], so that a white precipitate was generated. This precipitate was cleaned with methanol and was dried to obtain a precipitate including a single source precursor. In this single source precursor, a single complex molecule includes either Cu, In and Sc or Cu, Ga and Se.

[d] Pyridine which was an organic solvent was added to the precipitate including the single source precursor obtained in Step [c], so that a semiconductor forming solution was produced.

Next, a plurality of structures each formed by depositing a lower electrode layer made of Mo and the like on the surface of a substrate made of glass were prepared. The semiconductor forming solution was applied onto each of the lower electrode layers by a blade method to form films.

Thereafter, these films were held in nitrogen atmospheres having different water vapor concentrations (three water vapor concentrations of 300 ppm, 50 ppm and 0 ppm in volume fraction) at 350° C. for ten minutes, so that organic components were thermally decomposed.

Next, the films subjected to this thermal decomposition were heat-treated in an atmosphere of a gas mixture of hydrogen gas and selenium vapor gas. In this heat treatment, the temperature was increased from near room temperature to 550° C. for an hour, and was held at 550° C. for an hour, so that a first semiconductor layer having a thickness of 2 µm and made mainly of CIGS was formed.

Further, the substrates subjected to the processes until the formation of the aforementioned first semiconductor layer were immersed in a solution prepared by dissolving cadmium acetate and thiourea in aqueous ammonia, so that a second semiconductor layer having a thickness of 50 nm and made of CdS was formed on the first semiconductor layer. Then, an upper electrode layer made of ZnO and doped with Al was formed on this second semiconductor layer by a sputtering method. Thus, photoelectric conversion devices were produced.

The composition analysis of the first semiconductor layer in each of the photoelectric conversion devices produced in this manner and the measurement of the photoelectric conversion efficiency of each photoelectric conversion device were performed.

The composition analysis of the first semiconductor layer in each photoelectric conversion device was performed in a manner to be described below. First, a cross section of the first semiconductor layer was observed with a TEM. The composition analysis was performed by an EDS analysis at a point (a surface portion) 0 nm apart from the grain boundary toward the center of a semiconductor particle having a particle diameter of 500 nm and at a point (a central portion) 200 nm apart from the grain boundary toward the center thereof. The composition ratios $P_I$ and $P_{VI}$ were calculated at each of the points. The composition ratio $P_I$ in the central portion was denoted as $P_I$(central portion), and the composition ratio $P_I$ in the surface portion was denoted as $P_I$(surface portion). Then, the greater value of $P_I$(surface portion)/$P_I$(central portion) is indicative of the higher concentration of the group I-B element in the surface portion. Similarly, the composition ratio $P_{VI}$ in the central portion was denoted as $P_{VI}$(central portion), and the composition ratio $P_{VI}$ in the surface portion was denoted as $P_{VI}$(surface portion). Then, the greater value of $P_{VI}$(surface portion)/$P_{VI}$(central portion) is indicative of the higher concentration of the group VI-B element in the surface portion.

The values of $P_I$(surface portion)/$P_I$(central portion) of samples thermally decomposed with variations in water vapor concentration were as follows: 2.3 for a water vapor concentration of 50 ppm; 2.0 for a water vapor concentration of 300 ppm; and 1 for a water vapor concentration of 0 ppm. The values of $P_{VI}$(surface portion)/$P_{VI}$(central portion) thereof were as follows: 1.4 for a water vapor concentration of 50 ppm; 1.2 for a water vapor concentration of 300 ppm; and 1 for a water vapor concentration of 0 ppm.

The measurement of the photoelectric conversion efficiency of each photoelectric conversion device was performed in a manner to be described below. What is called a fixed light solar simulator was used to measure the photoelectric conversion efficiency under the conditions that the irradiation intensity of light at a light-receiving surface of each photoelectric conversion device was 100 mW/cm$^2$ and AM (air mass) was 1.5. The photoelectric conversion efficiencies versus the values of $P_I$(surface portion)/$P_I$(central portion) and $P_{VI}$(surface portion)/$P_{VI}$(central portion) obtained as a result of the composition analysis of the aforementioned first semiconductor layer are shown in FIGS. 11 and 12, respectively.

Figure 11:
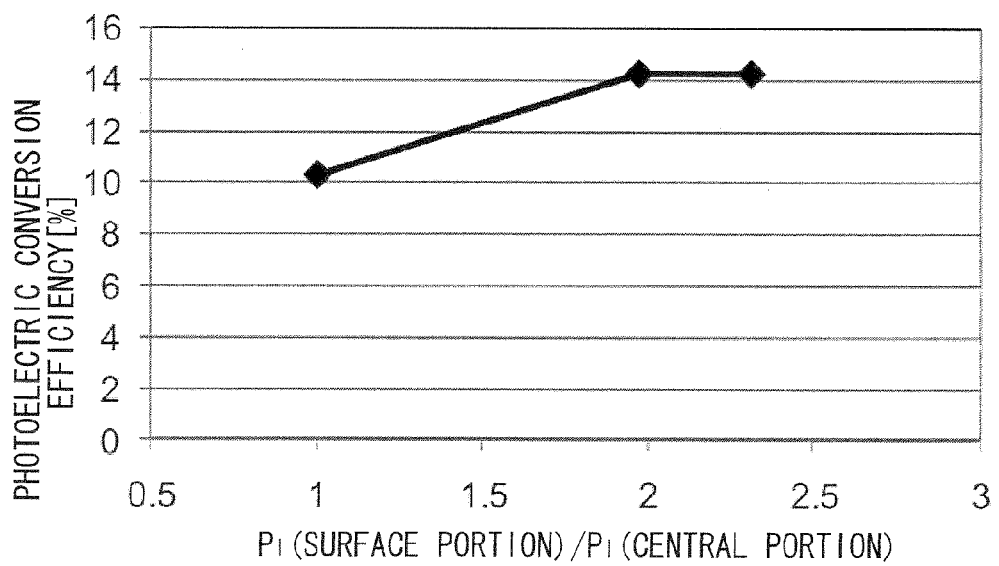
FIG. 11 is a graph showing elemental composition ratios in a semiconductor particle and photoelectric conversion efficiency.
Figure 12:
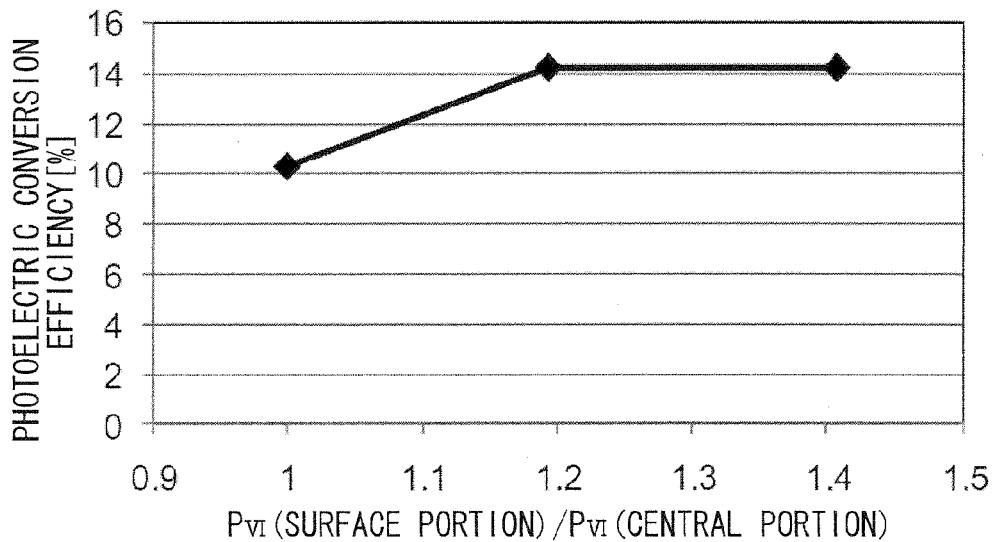
FIG. 12 is a graph showing elemental composition ratios in a semiconductor particle and photoelectric conversion efficiency.

The result shown in FIG. 11 showed that the greater the value of $P_I$(surface portion)/$P_I$(central portion), the higher the photoelectric conversion efficiency. Also, the result shown in FIG. 12 showed that the greater the value of $P_{VI}$(surface portion)/$P_{VI}$(central portion), the higher the photoelectric conversion efficiency.

REFERENCE SIGNS LIST

1 Substrate
2 Lower electrode layer
3 First semiconductor layer (light-absorbing layer)
4 Second semiconductor layer
5 Upper electrode layer
6 Connection conductor
7 Collecting electrodes
10 Photoelectric conversion cell
11 Photoelectric conversion device

The invention claimed is:

1. A photoelectric conversion device
wherein a polycrystalline semiconductor layer, including a plurality of semiconductor particles coupled together and a group III-B element included at a grain boundary of each of the semiconductor particles, is used as a light-absorbing layer,
wherein each of the semiconductor particles includes a group I-III-VI compound, and
wherein, in each of the plurality of semiconductor particles, a surface portion of the semiconductor particle has a higher composition ratio PI of a group I-B element to a group III-B element than a central portion of the semiconductor particle.

2. The photoelectric conversion device according to claim 1, wherein, in each of the plurality of semiconductor particles, a surface portion of the semiconductor particle has a higher composition ratio PVI of a group VI-B element to a group III-B element than the central portion of the semiconductor particle.

3. The photoelectric conversion device according to claim 2, wherein the composition ratio PI and the composition ratio PVI in each of the semiconductor particles increase gradually toward a surface of each of the semiconductor particles.

4. The photoelectric conversion device according to claim 1, wherein the group I-III-VI compound includes Cu as the group I-B element, and includes Se as the group VI-B element.

5. The photoelectric conversion device according to claim 4, wherein the group I-III-VI compound includes a combination of In and Ga as the group III-B element.

6. The photoelectric conversion device according to claim 1, wherein the light-absorbing layer includes a plurality of voids.

* * * * *